(12) United States Patent
Kitamura et al.

(10) Patent No.: US 11,963,333 B2
(45) Date of Patent: Apr. 16, 2024

(54) ELECTRONIC APPARATUS, COOLING DEVICE, AND METHOD FOR MANUFACTURING COOLING DEVICE

(71) Applicant: LENOVO (SINGAPORE) PTE. LTD., Singapore (SG)

(72) Inventors: Masahiro Kitamura, Yokohama (JP); Akinori Uchino, Yokohama (JP); Shusaku Tomizawa, Yokohama (JP)

(73) Assignee: LENOVO (SINGAPORE) PTE. LTD., Singapore (SG)

(*) Notice: Subject to any disclaimer, the term of this patent is extended or adjusted under 35 U.S.C. 154(b) by 153 days.

(21) Appl. No.: 17/656,908

(22) Filed: Mar. 29, 2022

(65) Prior Publication Data
US 2022/0369512 A1    Nov. 17, 2022

(51) Int. Cl.
*H05K 7/20* (2006.01)
*G06F 1/20* (2006.01)

(52) U.S. Cl.
CPC ......... *H05K 7/20336* (2013.01); *G06F 1/203* (2013.01); *H05K 7/2039* (2013.01)

(58) Field of Classification Search
CPC ........ H05K 7/20; H05K 7/12; H05K 7/20336; H05K 7/2039; G06F 1/203; G06F 1/20; G06F 1/16; H01L 23/40; H01L 23/427; F28D 15/02; F28D 15/00; F28D 7/00; F28F 9/007

See application file for complete search history.

(56) References Cited

U.S. PATENT DOCUMENTS

| | | | |
|---|---|---|---|
| 7,436,673 B2* | 10/2008 | Wang | G06F 1/20 165/185 |
| 2004/0001316 A1* | 1/2004 | Kamikawa | F28D 15/0275 361/699 |

(Continued)

FOREIGN PATENT DOCUMENTS

| | | |
|---|---|---|
| JP | 10291045 A | 11/1998 |
| JP | 2004039685 A | 2/2004 |

(Continued)

OTHER PUBLICATIONS

Wu an-zhi, Embedded heat spreader, May 2012 TW-M428398-U (Year: 2012).*

(Continued)

*Primary Examiner* — Michael A Matey
(74) *Attorney, Agent, or Firm* — SHIMOKAJI IP

(57) ABSTRACT

An electronic apparatus includes: a chassis; a heat generating element provided in the chassis; and a cooling device that has a cooling fin, a heat pipe connecting the cooling fin and the heat generating element, and a pressing assembly pressing the heat pipe against the heat generating element, and is provided in the chassis. The heat pipe has: a heat absorbing section that absorbs heat generated by the heat generating element; and a thin plate section having a thickness which is smaller than that of the heat absorbing section. The pressing assembly has: a base assembly relatively fixed to the chassis; and a bridge section that is provided integrally with the base assembly and placed on a surface of the thin plate section in such a manner as to extend over the heat pipe in a width direction.

4 Claims, 10 Drawing Sheets

(56) References Cited

U.S. PATENT DOCUMENTS

| | | | | |
|---|---|---|---|---|
| 2005/0045310 A1* | 3/2005 | Okutsu | ............... | F28D 15/04 257/E23.099 |
| 2006/0195710 A1* | 8/2006 | Maeshima | ............ | G06F 1/206 713/320 |
| 2007/0195500 A1* | 8/2007 | Cheng | ............... | F28D 15/0233 361/185 |
| 2007/0236885 A1* | 10/2007 | Zhao | ............... | H01L 23/427 257/E23.088 |
| 2007/0251676 A1* | 11/2007 | Cheng | ............... | F28D 15/0275 257/E23.099 |
| 2008/0135210 A1* | 6/2008 | Wang | ............... | H01L 23/467 165/104.33 |
| 2008/0202740 A1* | 8/2008 | Hung | ............... | F28D 15/0275 165/185 |
| 2010/0236756 A1* | 9/2010 | Yang | ............... | F28D 15/0275 165/80.3 |
| 2012/0160456 A1* | 6/2012 | Aoki | ............... | H01L 23/427 165/104.26 |
| 2012/0211203 A1* | 8/2012 | Chang | ............... | F28D 15/0275 165/104.26 |
| 2012/0267078 A1* | 10/2012 | Wu | ............... | F28D 15/0275 165/104.26 |
| 2013/0087311 A1* | 4/2013 | Lee | ............... | F28D 15/02 165/67 |
| 2013/0168058 A1* | 7/2013 | Chamseddine | ......... | G06F 1/203 165/104.26 |
| 2013/0168060 A1* | 7/2013 | Chang | ............... | F28F 1/32 165/104.34 |
| 2013/0299213 A1* | 11/2013 | Li | ............... | H01L 23/427 165/104.26 |
| 2015/0330716 A1* | 11/2015 | Chen | ............... | F28D 15/0275 165/104.26 |
| 2017/0024029 A1* | 1/2017 | Kitamura | ............... | G06F 1/169 |
| 2017/0295640 A1* | 10/2017 | Tsunoda | ............... | G06F 1/203 |
| 2020/0072247 A1* | 3/2020 | Watanabe | ............ | F04D 29/4226 |
| 2020/0341525 A1* | 10/2020 | Uchino | ............... | G06F 1/203 |
| 2020/0362880 A1* | 11/2020 | Nakamura | ............ | F04D 29/4226 |
| 2021/0015007 A1* | 1/2021 | Watanabe | ............ | H05K 7/20481 |
| 2021/0337699 A1* | 10/2021 | Watanabe | ............ | H05K 7/2039 |
| 2022/0068761 A1* | 3/2022 | Yamasaki | ............... | G06F 1/183 |

FOREIGN PATENT DOCUMENTS

| | | |
|---|---|---|
| JP | 2010226114 A | 10/2010 |
| JP | 2019023839 A | 2/2019 |

OTHER PUBLICATIONS

Masuko K, method for sealing end part of heat pipe, Oct. 2000, JP-2000274974-A (Year: 2000).*

* cited by examiner

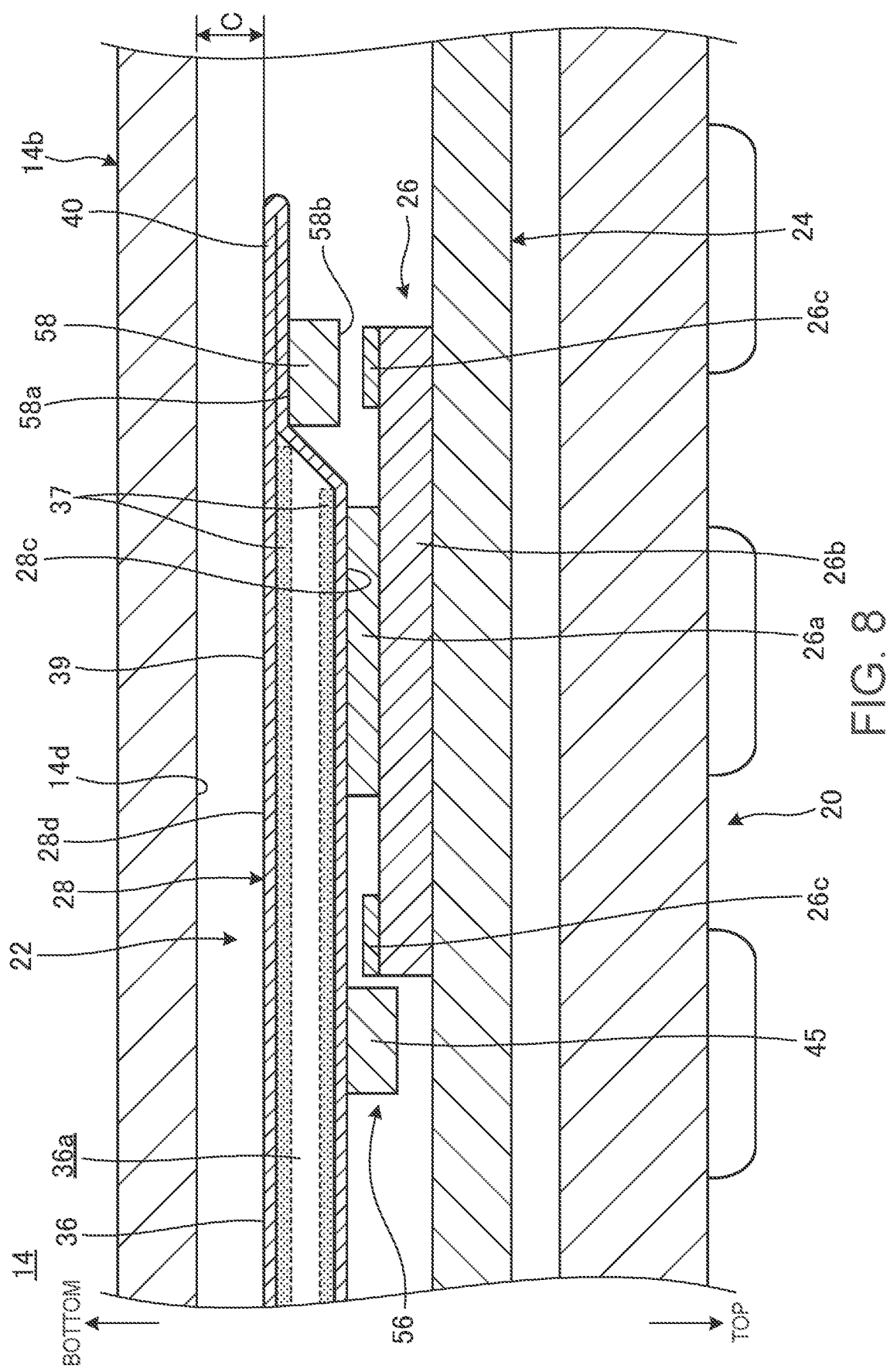

ELECTRONIC APPARATUS, COOLING DEVICE, AND METHOD FOR MANUFACTURING COOLING DEVICE

TECHNICAL FIELD

The present disclosure relates to an electronic apparatus, a cooling device, and a method for manufacturing a cooling device.

BACKGROUND

An electronic apparatus such as a laptop PC may be provided with a cooling device configured to cool a heat generating element such as a CPU.

SUMMARY

An electronic apparatus according to the first aspect of the present disclosure includes: a chassis; a heat generating element provided in the chassis; and a cooling device that has a cooling fin, a heat pipe connecting the cooling fin and the heat generating element, and a pressing assembly pressing the heat pipe against the heat generating element, and is provided in the chassis, wherein the heat pipe has: a heat absorbing section that absorbs heat generated by the heat generating element; a heat dissipating section that dissipates the heat absorbed by the heat absorbing section to the cooling fin; and a thin plate section that is provided at an end portion on the opposite side from the heat dissipating section as viewed from the heat absorbing section, and has a thickness which is smaller than that of the heat absorbing section, and the pressing assembly has: a base assembly relatively fixed to the chassis; and a bridge section that is provided integrally with the base assembly and placed on a surface of the thin plate section in such a manner as to extend over the heat pipe in a width direction.

A cooling device according to the second aspect of the present disclosure includes: a cooling fin; a heat pipe having a first end section thereof connected to the cooling fin; and a pressing assembly that is fixed to a second end section of the heat pipe to press the heat pipe against an object to be cooled, wherein the heat pipe has: a heat absorbing section configured to absorb heat of the object to be cooled; a heat dissipating section configured to dissipate the heat absorbed by the heat absorbing section to the cooling fin; and a thin plate section that is provided closer to a distal end with respect to the heat absorbing section in the second end section, and has a thickness which is smaller than that of the heat absorbing section, and the pressing assembly has a bridge section placed on a surface of the thin plate section in such a manner as to extend over the heat pipe in a width direction.

A method for manufacturing a cooling device according to the third aspect of the present disclosure has: a first step of crushing one end portion of a heat pipe in a plate thickness direction to form a thin plate section; and a second step of fixing, to the heat pipe, a pressing assembly configured to press the heat pipe against an object to be cooled, wherein the second step places a bridge section of the pressing assembly to a surface of the thin plate section, and fixes the pressing assembly and the heat pipe after the bridge section is placed in such a manner as to extend over the heat pipe in a width direction.

BRIEF DESCRIPTION OF THE DRAWINGS

FIG. 8 is an enlarged schematic side sectional view of a pressing assembly and its surrounding area.

DETAILED DESCRIPTION

The following will describe in detail preferred embodiments of an electronic apparatus and a cooling device according to the present disclosure with reference to the accompanying drawings.

There is a great demand for a thinner chassis for an electronic apparatus. On the other hand, improving a processing capacity of a semiconductor chip such as a CPU mounted in a chassis may result in an increase in the amount of heat generated or the thickness of the semiconductor chip. For this reason, a cooling device is required to become even more thin while maintaining or improving its cooling capacity.

Figure 1:
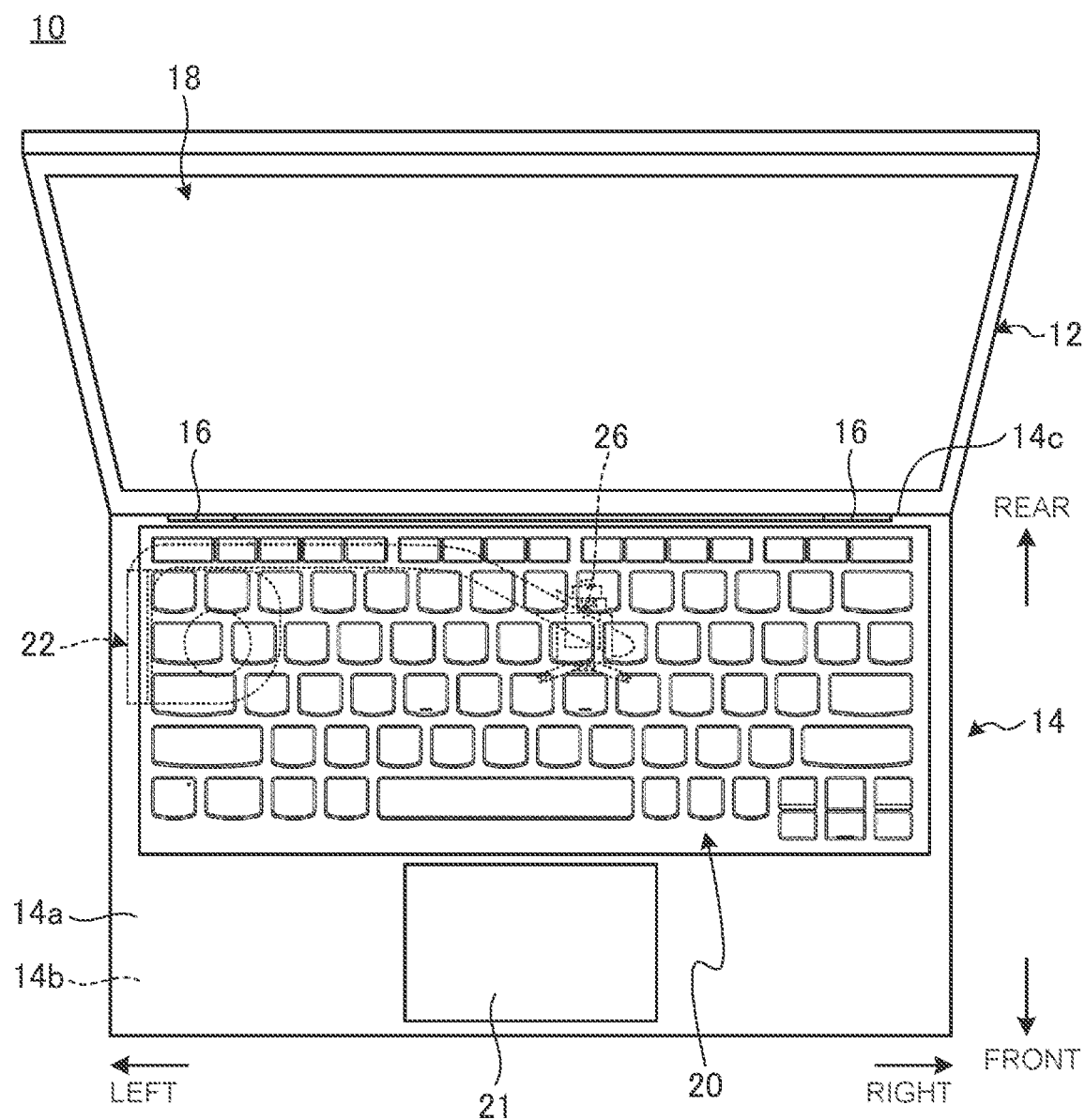
FIG. 1 is a schematic plan view of an electronic apparatus according to an embodiment viewed from above.

In this regard, FIG. 1 is a schematic plan view of an electronic apparatus 10 according to an embodiment viewed from above. As illustrated in FIG. 1, the electronic apparatus 10 is a clamshell type laptop PC that has a display chassis 12 and a chassis 14 connected by hinges 16 in a relatively rotatable manner. The electronic apparatus according to the present disclosure may be, for example, a flat tablet type PC, a mobile phone, a smartphone, or a portable game machine other than a laptop PC.

The display chassis 12 is a thin, flat box body. A display 18 is mounted on the display chassis 12. The display 18 is composed of, for example, an organic light emitting diode (OLED) or a liquid crystal.

Hereinafter, the chassis 14 and each element mounted in the chassis 14 will be described by referring a front side to the front, a back side to the rear, a width direction to the left-right, and a height direction to the top-bottom on the basis of a reference posture in which the chassis 12 and 14 are opened as illustrated in FIG. 1, and the display 18 is visually recognized while a keyboard 20 is being operated.

The chassis 14 is a thin, flat box body. The chassis 14 is composed of an upper cover member 14a that forms the upper surface and the four peripheral side surfaces, and a lower cover member 14b that forms the bottom surface. The keyboard 20 and a touch pad 21 are provided on the upper surface of the chassis 14. A cooling device 22 according to the present embodiment is mounted in the chassis 14. A rear end section 14c of the chassis 14 is connected to the display chassis 12 by using the hinges 16.

Figure 2:
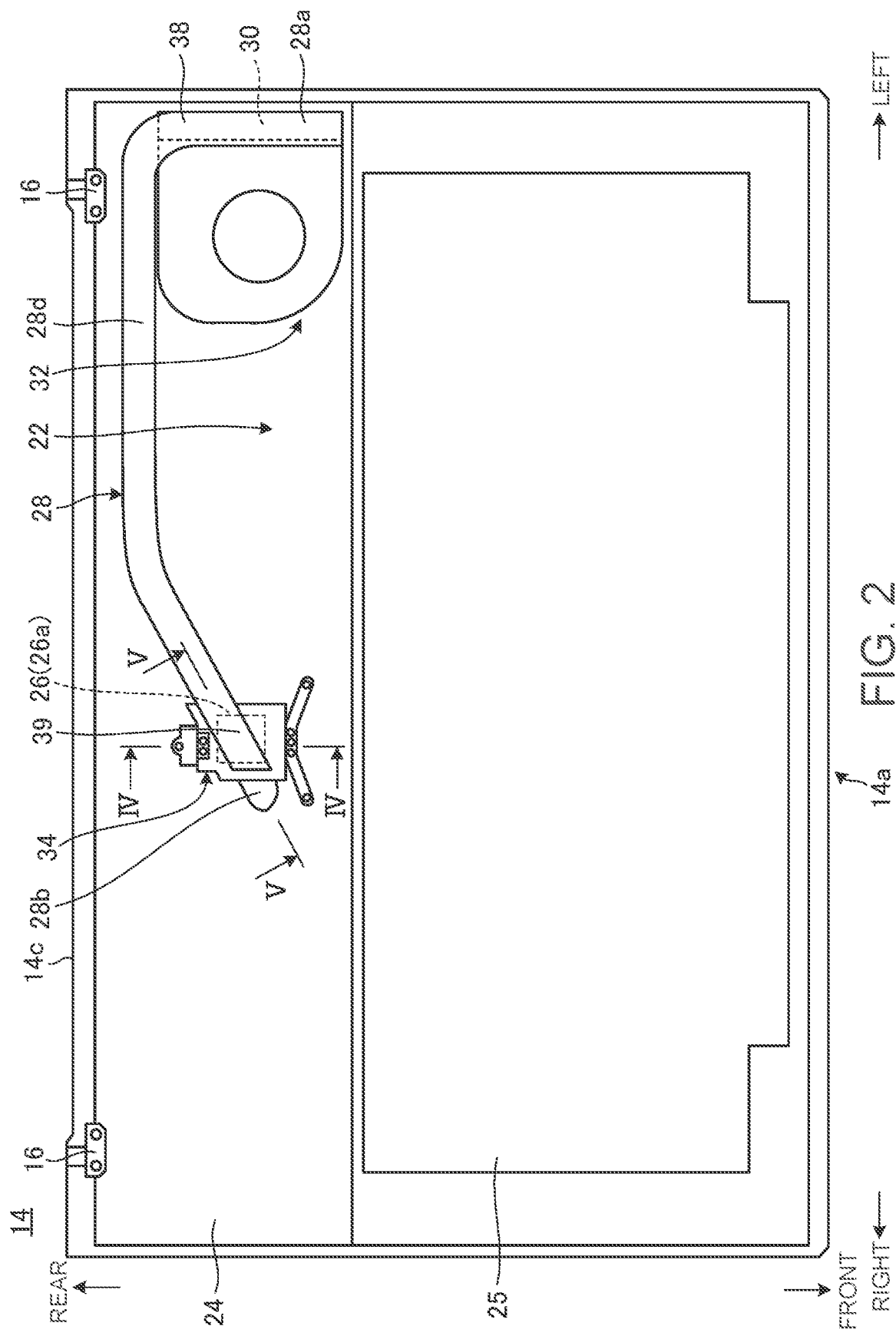
FIG. 2 is a bottom view schematically illustrating the internal structure of a chassis.

FIG. 2 is a bottom view schematically illustrating the internal structure of the chassis 14. FIG. 2 is a view of the inside of the chassis 14 observed from the inner surface side of the upper cover member 14a, with the lower cover member 14b removed.

As illustrated in FIG. 2, a motherboard 24, a battery device 25, and the cooling device 22 are provided in the chassis 14. In addition, various electronic components, mechanical components, and the like are provided in the chassis 14.

The motherboard 24 is a mainboard of the electronic apparatus 10. The motherboard 24 is placed adjacently to the rear of the chassis 14 and extends in the left-right direction. The motherboard 24 is a printed board on which a central processing unit (CPU) 26 and the like are mounted. The CPU 26 performs calculation related to main control and processing of the electronic apparatus 10. The CPU 26 is one of the largest heat generating elements among electronic components mounted in the chassis 14. As such, in the present disclosure, the term "heat generating element" may refer specifically to the CPU 26, or may refer to any of the other electronic components that generate heat during operation. The motherboard 24 further has a graphics processing unit (GPU), an SSD, a communication module, a DC/DC converter, and the like mounted thereon. The motherboard 24 is placed under the keyboard 20 (refer to FIG. 4) and screwed to the lower surface of the keyboard 20 or the inner surface of the upper cover member 14a. The upper surface of the motherboard 24 serves as the surface to be installed to the upper cover member 14a, and the lower surface thereof serves as the surface on which electronic components such as the CPU 26 are mounted.

The battery device 25 is a rechargeable battery serving as the power supply of the electronic apparatus 10. The battery device 25 is placed in front of the motherboard and occupies approximately half the front area of the chassis 14.

The configuration of the cooling device 22 will now be described.

The cooling device 22 according to the present embodiment is a device that absorbs and transports the heat generated by the CPU 26 and discharges the heat to the outside of the chassis 14. An electronic component to be cooled by the cooling device 22 may be a GPU or the like other than the CPU 26, and two or more objects to be cooled may be cooled at the same time. The cooling device 22 is stacked on the lower surface of the motherboard 24 (the mounting surface for the CPU 26 and the like).

Figure 3A:
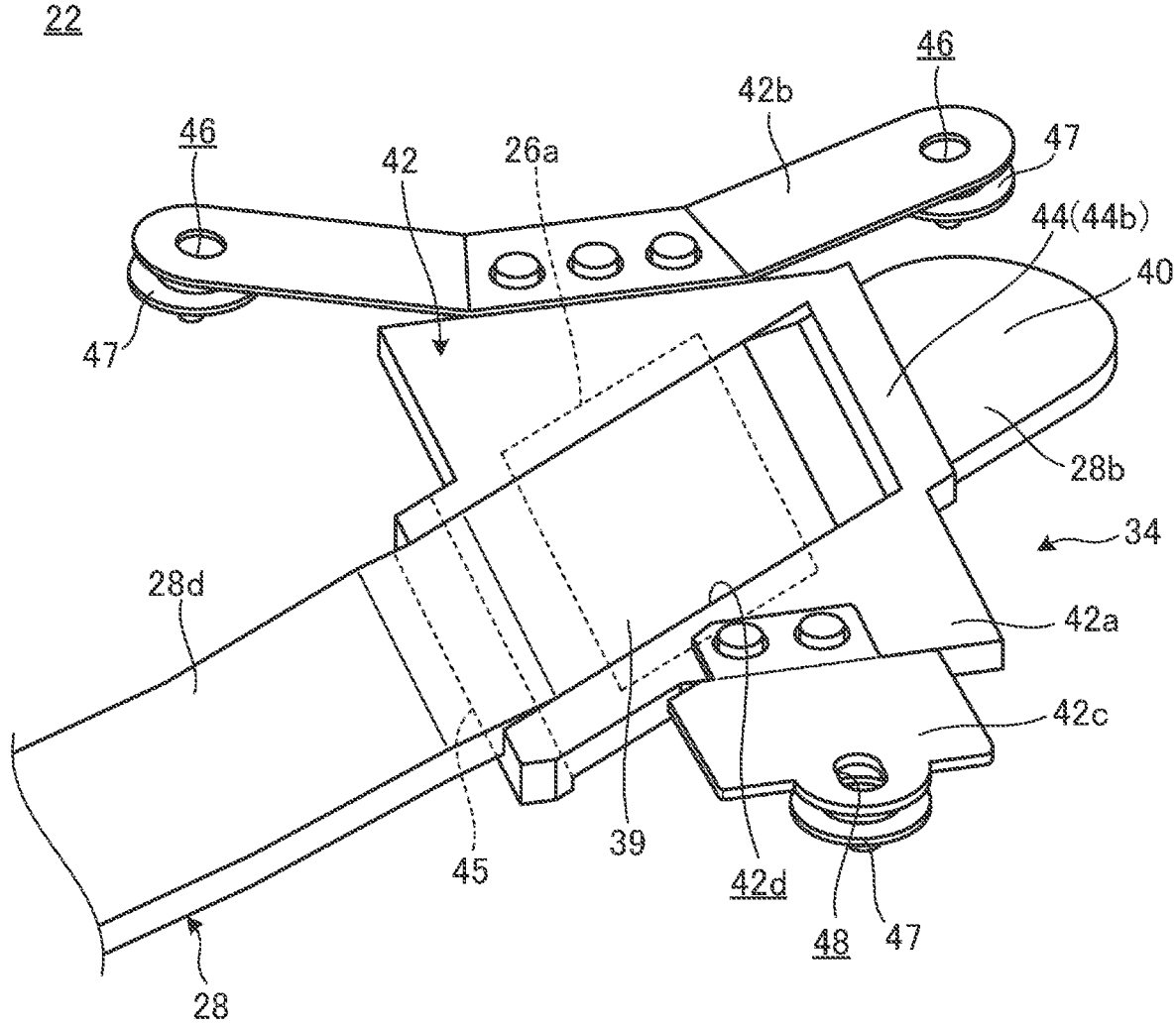
FIG. 3A is an enlarged perspective view of a pressing assembly and its surrounding area of a cooling device viewed from below.
Figure 3B:
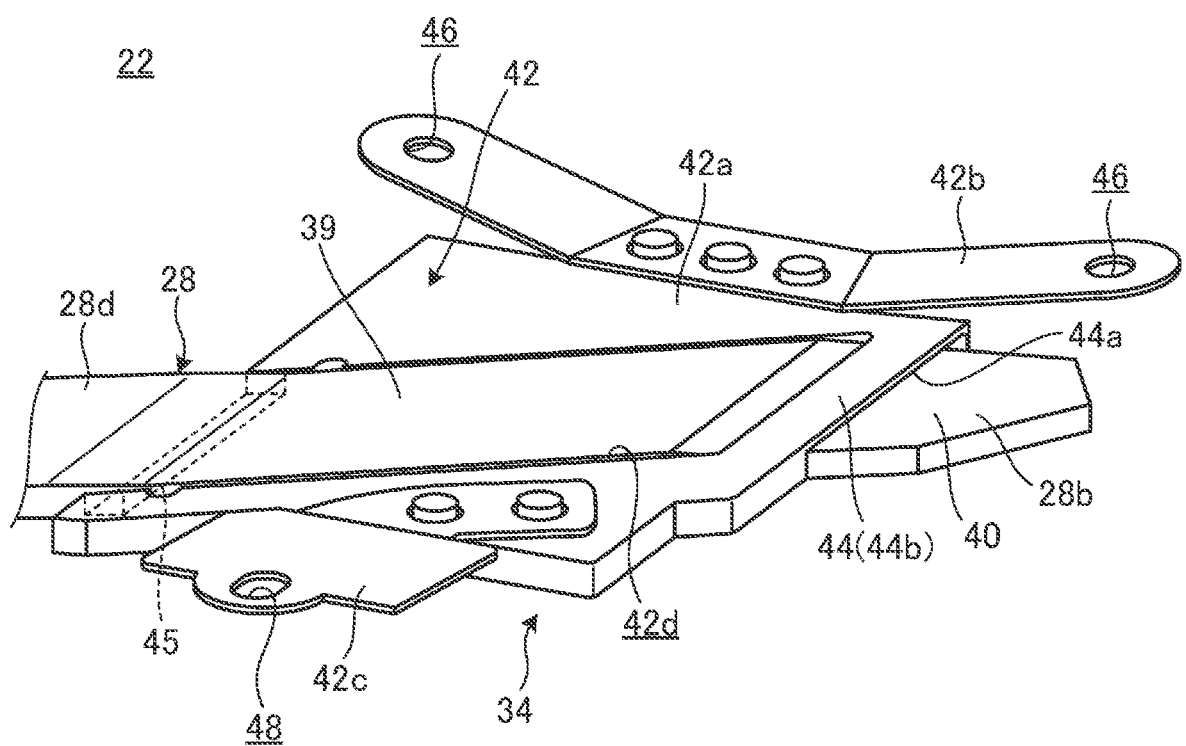
FIG. 3B is a perspective view of the pressing assembly and its surrounding area illustrated in FIG. 3A, which are viewed from a different angle.
Figure 4:
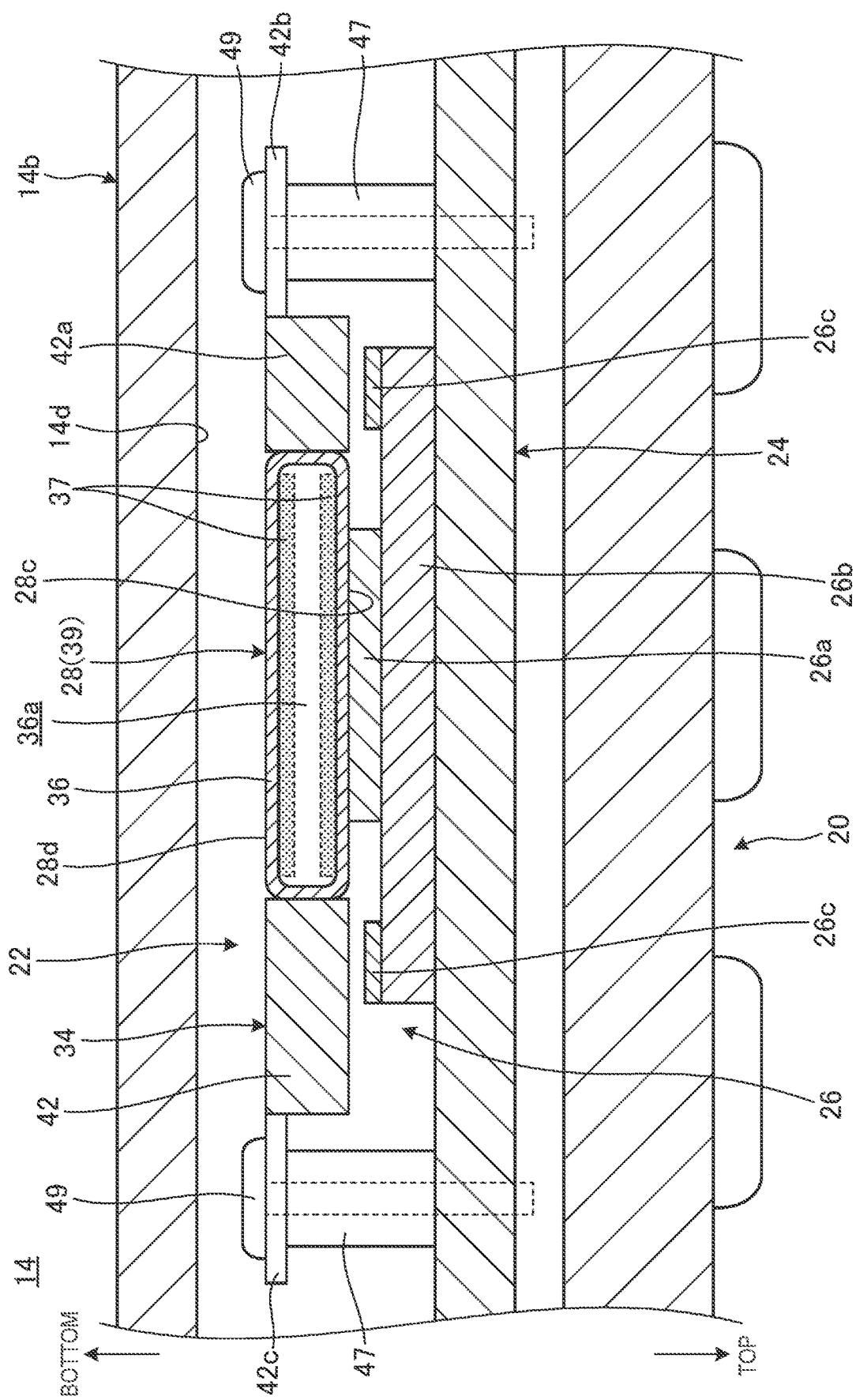
FIG. 4 is a schematic sectional view taken along line IV-IV in FIG. 2.
Figure 5:
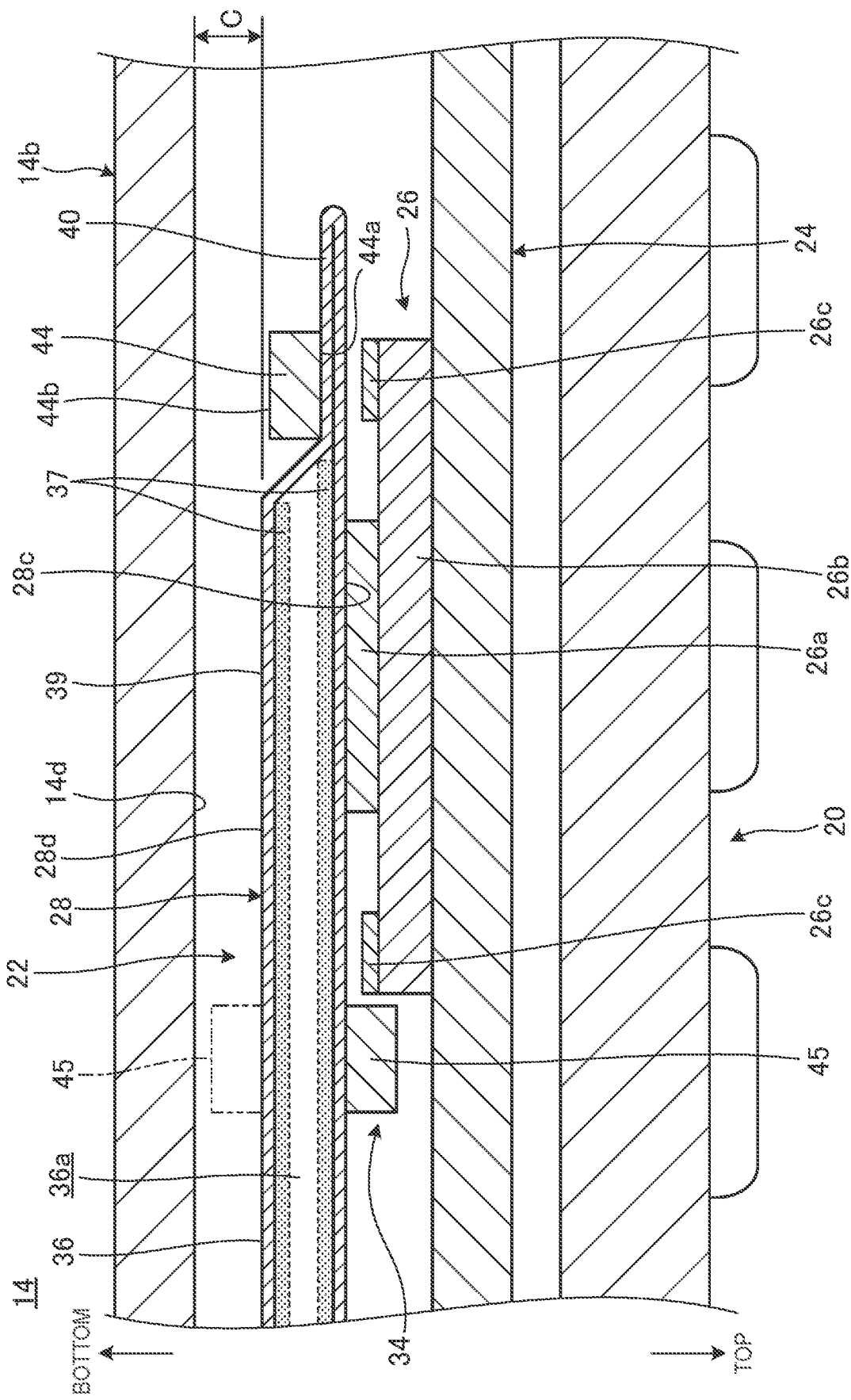
FIG. 5 is a schematic sectional view taken along line V-V in FIG. 2.

FIG. 3A is an enlarged perspective view of a pressing assembly 34 and its surrounding area of the cooling device 22 viewed from below. FIG. 3B is a perspective view of the pressing assembly 34 and its surrounding area illustrated in FIG. 3A, which is viewed from a different angle. FIG. 4 is a schematic sectional view taken along line IV-IV in FIG. 2. FIG. 5 is a schematic sectional view taken along line V-V in FIG. 2.

Before describing the cooling device 22, a configuration example of the CPU 26 will be described. As illustrated in FIG. 4 and FIG. 5, the CPU 26 has a semiconductor chip 26a called a die, a substrate 26b, which is a substrate to be mounted on the motherboard 24, and a stiffener 26c, which is a reinforcing material. In the CPU 26, the semiconductor chip 26a, in particular, is a heat generating part. Therefore, the cooling device 22 is installed in such a manner as to absorb the heat of the semiconductor chip 26a.

As illustrated in FIG. 2, the cooling device 22 includes a heat pipe 28, a cooling fin 30, a blower fan 32, and the pressing assembly 34.

As illustrated in FIG. 2 and FIG. 4, the heat pipe 28 is a pipe type heat transport device. The heat pipe 28 is formed by sealing a working fluid in a sealed space 36a formed in a metal pipe 36. The metal pipe 36 is a flat pipe formed of a metal having a high thermal conductivity such as aluminum, copper, or stainless steel and having an elliptical cross-sectional shape. The sealed space 36a is a flow passage through which the sealed working fluid flows while undergoing a phase change. Examples of the working fluid include water, CFC substitutes, acetone or butane, or the like. In the sealed space 36a, wicks 37 that feed a condensed working fluid by capillary action are provided. The wicks 37 are formed of, for example, a mesh of fine metal wires woven into a cotton-like structure, a porous layer, or the like.

As illustrated in FIG. 2, the heat pipe 28 extends substantially in the left-right direction on the lower surface side of the motherboard 24. In the heat pipe 28, a first end section 28a is connected to the cooling fin 30, and a second end section 28b is connected to the CPU 26. In the configuration example illustrated in FIG. 2, the cooling fin 30 is installed along the front-rear direction, facing the left side surface of the chassis 14, and the CPU 26 is installed substantially at the center of the chassis 14. Thus, the heat pipe 28 is formed in a substantially L shape in a plan view, and connects the cooling fin 30 and the CPU 26.

The heat pipe 28 has a heat dissipating section 38 at the first end section 28a, and a heat absorbing section at the second end section 28b. The heat dissipating section 38 is a section that dissipates the heat, which has been absorbed by the heat absorbing section 39 and transported by an evaporated working fluid, to the outside. The heat dissipating section 38 is joined to the cooling fin 30. The heat absorbing section 39 is a section that absorbs the heat generated by the semiconductor chip 26a. The heat absorbing section 39 is pressed against the top surface of the semiconductor chip 26a by the pressing assembly 34. An upper surface 28c of the heat absorbing section 39 and the top surface of the semiconductor chip 26a are in close contact with each other with a heat conductive grease or the like interposed therebetween.

Meanwhile, a heat pipe is generally closed at one end by mechanical molding, and the other end thereof is sealed by soldering or the like after injecting a working fluid into a sealed space. Consequently, within a certain range from both ends, the metal pipe 36 is deformed and the predetermined sealed space 36a cannot be formed, thus preventing the wicks 37 from being installed. In other words, in the case of the heat pipe 28 of this embodiment also, the distal ends of the end sections 28a and 28b and the vicinities thereof are dead spaces that hardly contribute to heat transfer or heat transport. For this reason, the heat absorbing section 39 is provided at a position slightly offset from the distal end of the second end section 28b toward the first end section 28a. The heat dissipating section 38 has a larger area of contact with the cooling fin 30 than that of the heat absorbing section 39, so that the heat dissipating section 38 is not placed offset like the heat absorbing section 39 (refer to FIG. 2).

As illustrated in FIG. 3A, FIG. 3B, and FIG. 5, the heat pipe 28 has a thin plate section 40 at the dead space of the second end section 28b described above.

The thin plate section 40 is provided closer to the distal end than the heat absorbing section 39. In other words, the thin plate section 40 is provided at the end portion on the side opposite to the heat dissipating section 38 side when viewed from the heat absorbing section 39. A lower surface 28d of the heat pipe 28 is lowered by one level toward the upper surface 28c on the back side from the heat absorbing section 39 to the thin plate section 40. Thus, the thickness of the thin plate section 40 is smaller than the thickness of the heat absorbing section 39. The heat pipe 28 of the present embodiment is configured to have substantially the same thickness except for the thin plate section 40, and to have only the thickness of the thin plate section 40 smaller than that of the rest thereof. The thin plate section 40 has a structure in which the lower surface 28d is crushed toward the upper surface 28c.

As illustrated in FIG. 2, the cooling fin 30 is placed facing an exhaust port formed in the left side surface of the chassis 14. The cooling fin 30 is formed of a block of metal with high thermal conductivity such as aluminum, copper, or stainless steel with a plurality of slits formed to penetrate in the inner-outer direction (left-right direction) of the chassis 14. The cooling fin 30 is joined to the upper surface 28c of the heat pipe 28. The exhaust port of the chassis 14 and the cooling fin 30 may be provided on the right side surface or the rear side surface of the chassis 14.

As illustrated in FIG. 2, the blower fan 32 is placed in a portion where the right end portion of the motherboard 24 is cut out. The blower fan 32 has air intake ports formed in the upper and lower surfaces thereof, an air discharge port formed in the right side surface, and the air discharge port opening on the side surface facing the cooling fin 30. The blower fan 32 exhausts air drawn in from the inside of the chassis 14 to the outside of the chassis 14 through the slits of the cooling fin 30.

As illustrated in FIG. 2 to FIG. 5, the pressing assembly 34 is a component configured to press the heat absorbing section 39 of the heat pipe 28 against the CPU 26. The pressing assembly 34 has a base assembly 42, a first bridge section 44, and a second bridge section 45.

The base assembly 42 is a mounting section configured to fix the pressing assembly 34 to the motherboard 24. The base assembly 42 is relatively fixed to the chassis 14 by being fixed to the motherboard 24. The base assembly 42 may be directly fixed to the chassis 14 or a bracket or the like fixed to the chassis 14 rather than the motherboard 24. The base assembly 42 has a base plate 42a and a pair of leaf springs 42b and 42c.

The base plate 42a is a metal plate divided into two by a split 42d. The divided plates are united by the bridge sections 44 and 45. The split 42d is configured to have a width dimension that allows the second end section 28b of the heat pipe 28 to be inserted therein with almost no gap. The base plate 42a is formed of a metal with high thermal conductivity, such as aluminum, copper, or stainless steel. The inner wall surfaces of the base plate 42a, which face each other on the inner side of the split 42d, are joined to the heat pipe 28 by soldering or the like.

The leaf springs 42b and 42c are elastic thin metal plates. The leaf spring 42b is formed, for example, in a substantially boomerang shape in a plan view, and a central portion in the longitudinal direction is fixed to the base plate 42a. The leaf spring 42c is formed, for example, in a substantially rectangular shape, and one end thereof is fixed to the base plate 42a. The structure for fixing the leaf springs 42b and 42c to the base plate 42a is, for example, a structure in which pins protruding from the surface of the base plate 42a are fitted into holes provided in the leaf springs 42b and 42c. The leaf springs 42b and 42c may be fixed to the base plate 42a by screwing, or welding or the like.

The leaf spring 42b has holes 46 at both end portions thereof. The leaf spring 42b is fastened to the motherboard 24 by using a screw 49 passed through each hole 46 and each spacer 47 coaxially placed with each hole 46 (refer to FIG. 4). The leaf spring 42c has a hole 48 at the distal end portion in the direction of protrusion from the base plate 42a. As with the leaf spring 42b, the leaf spring 42c is fastened to the motherboard 24 by using the spacer 47 and the screw 49 (refer to FIG. 4).

The first bridge section 44 is a thin strip-shaped plate that is integrally formed with the base plate 42a and is provided in such a manner as to extend over the split 42d. The first bridge section 44 may be configured as a separate component from the base plate 42a and may be integrally fixed to the base plate 42a by screwing, soldering, or the like. The first bridge section 44 is placed in such a manner as to extend on the lower surface 28d side of the heat pipe 28 in the width direction. The first bridge section 44 is placed on the surface (the lower surface 28d) of the thin plate section 40. A back surface 44a of the first bridge section 44 is joined to the surface of the thin plate section 40 by soldering or the like. A surface 44b of the first bridge section 44 is preferably positioned to be flush with or lower than the surface of the heat absorbing section 39 (the lower surface 28d) (refer to FIG. 5). In other words, the surface of the thin plate section 40 (the lower surface 28d) is lower than the surface of the heat absorbing section 39 (the lower surface 28d) by the height of the first bridge section 44 or more.

The second bridge section 45 is a thin strip-shaped plate that is integrally formed with the base plate 42a and is provided in such a manner as to extend over the split 42d. The second bridge section 45 may be configured as a separate component from the base plate 42a and may be integrally fixed to the base plate 42a by screwing, soldering, or the like. The second bridge section 45 is placed in such a manner as to sandwich the heat absorbing section 39 between itself and the first bridge section 44 with reference to the longitudinal direction of the heat pipe 28. In other words, the heat absorbing section 39 is placed between the bridge sections 44 and 45. The second bridge section 45 is placed in such a manner as to extend on the upper surface 28c side of the heat pipe 28 in the width direction. The second bridge section 45 is joined to the back surface of the heat pipe 28 (the upper surface 28c) by soldering or the like.

The pressing assembly 34 described above firmly presses the base plate 42a and the heat pipe 28 (the heat absorbing section 39) fixed with the bridge sections 44, 45 against the semiconductor chip 26a by the urging forces of the leaf springs 42b, 42c. This thermally connects the heat absorbing section 39 with the CPU 26 thereby to efficiently absorb the heat generated by the CPU 26.

As described above, the electronic apparatus 10 according to the present embodiment and the cooling device 22 mounted thereon have the heat absorbing section 39 and the thin plate section 40 provided in this order toward the distal end of the second end section 28b of the heat pipe 28. Further, the pressing assembly 34, which presses the heat absorbing section 39 of the heat pipe 28 against the CPU 26, has the first bridge section 44 placed on the surface of the thin plate section 40, extending over the heat pipe 28 in the width direction.

Consequently, as illustrated in FIG. 4 and FIG. 5, in the electronic apparatus 10, the heat absorbing section 39 of the heat pipe 28 and the CPU 26 are stacked in this order from bottom to top in the thickness direction of the chassis 14. At this time, in the pressing assembly 34, the base plate 42a is placed on the side of the heat absorbing section 39, and the first bridge section 44 is placed on the lower surface 28d of the thin plate section 40. This enables the pressing assembly 34 to press the heat pipe 28 against the CPU 26 without protruding below the lower surface 28d of the heat pipe 28.

As a result, as illustrated in FIG. 5, a clearance C formed between an inner surface 14d of the lower cover member 14b of the chassis 14 and the lowermost surfaces of the heat absorbing section 39 and the pressing assembly (the surface 44b of the first bridge section 44) can be ensured to have a predetermined value or more. Further, unlike a comparative pressing assembly with an intervening copper plate, the pressing assembly 34 does not have a copper plate or the like sandwiched between a heat pipe and a CPU, thus making the pressing assembly 34 thinner accordingly.

As seen from the above, the electronic apparatus can make the cooling device 22 thinner, so that the chassis can be also made thinner. In addition, the electronic apparatus 10 can secure the sufficient clearance C, thus making it possible to suppress the development of a localized high-temperature portion (hot spot) on the bottom surface of the chassis 14 (the outer surface of the lower cover member 14b) caused by the heat of the CPU 26 or the heat pipe 28. Further, the cooling device 22 has the structure in which the pressing assembly 34 does not protrude toward the inner surface 14d of the chassis 14, so that the overall structure can be made thinner without making the thickness of the heat pipe 28 smaller than that of the comparative pressing assembly. As a result, the cooling device 22 can be made thinner as a whole while ensuring a cooling capacity equal to or higher than that of the comparative pressing assembly.

The first bridge section 44 may be placed at a position that is slightly higher than the surface of the heat absorbing section 39 (the lower surface 28d). This is because even if the first bridge section 44 slightly protrudes from the surface of the heat absorbing section 39 (the lower surface 28d), the surface area thereof is small, and the influence on a hot spot is small.

The thin plate section 40 is preferably placed at a position not overlapping the CPU 26 in a plan view. This is because the thin plate section 40 is a dead space not involved in the heat transport of the heat pipe 28 as described above, so that the contact with the CPU 26, from which the heat is to be absorbed, suppresses the heat absorption by the heat absorbing section 39. In the CPU 26, the actual heat generating section is the semiconductor chip 26a, so that the thin plate section 40 should be placed at a position not overlapping at least the semiconductor chip 26a.

The pressing assembly 34 is further provided with the second bridge section 45, so that the pressing assembly 34 can further uniformly and stably press the heat pipe 28 against the CPU 26. In the configuration example illustrated in FIG. 5, the second bridge section 45 is placed on the upper surface 28c side of the heat pipe 28. This enables the second bridge section 45 to draw the heat pipe 28, which is joined to the lower surface thereof, toward the CPU 26 without protruding toward the inner surface 14d of the chassis 14.

As indicated by the two-dot chain line in FIG. 5, the second bridge section 45 may be placed on the lower surface 28d side of the heat pipe 28. In this case, the second bridge section 45, which becomes hot together with the heat pipe 28, will be close to the inner surface 14d. However, the surface area is minimal, so that the impact on a hot spot is also minimal. The base assembly 42 and the first bridge section 44 can exert a sufficient pressing force, so that it is unnecessary to provide the pressing assembly 34 with the second bridge section 45.

Figure 6A:
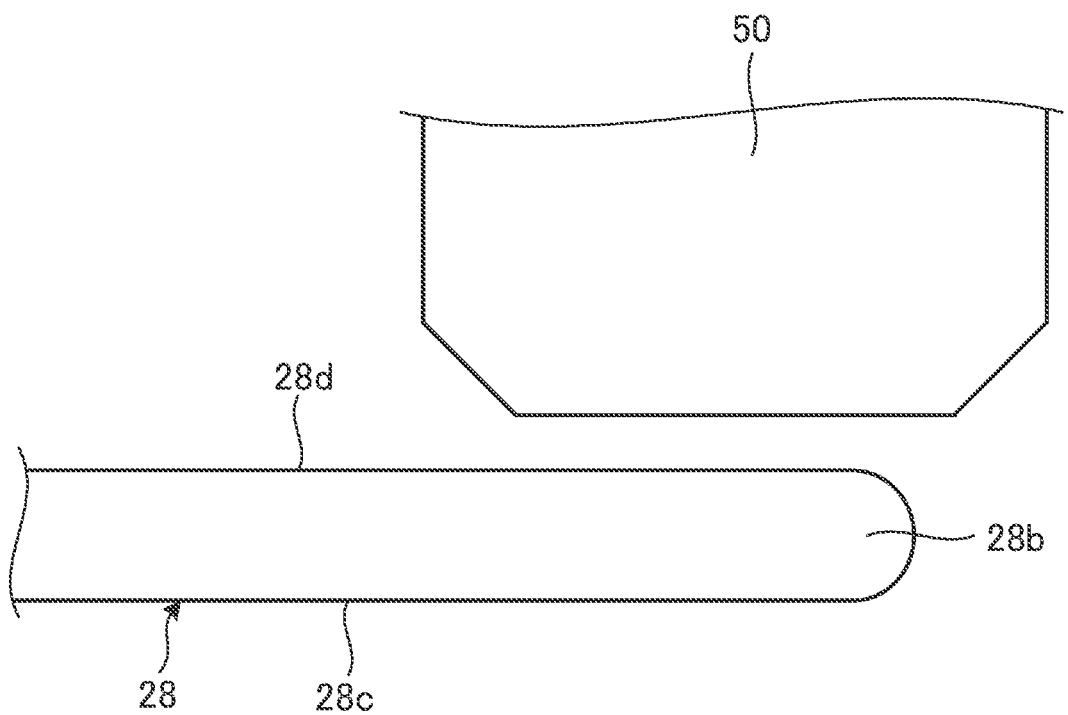
FIG. 6A is a schematic side view illustrating a heat pipe before a thin plate section is formed.
Figure 6B:
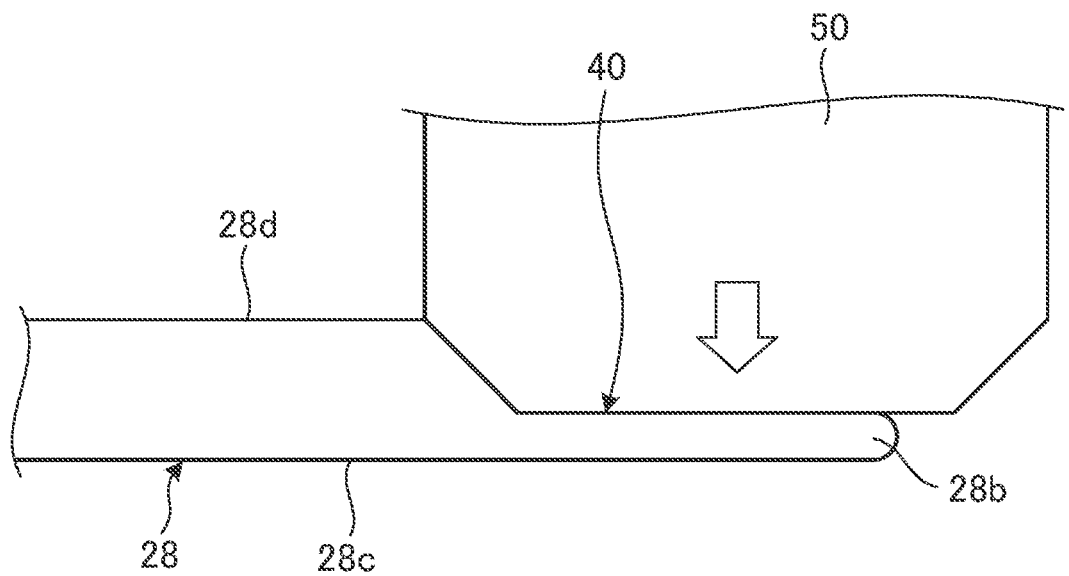
FIG. 6B is a side view illustrating a state immediately after the thin plate section has been formed from the state illustrated in FIG. 6A.

A description will now be given of a procedure of the method for manufacturing the cooling device 22. FIG. 6A is a schematic side view illustrating the heat pipe 28 before the thin plate section 40 is formed. FIG. 6B is a side view illustrating a state immediately after the thin plate section 40 has been formed from the state illustrated in FIG. 6A.

To manufacture the cooling device 22, first, a general heat pipe 28 that does not have the thin plate section 40, and the pressing assembly 34 are prepared. Next, the thin plate section 40 is formed. First, the second end section 28b of the heat pipe 28 is set on a predetermined jig. Then, as illustrated in FIG. 6A and FIG. 6B, a predetermined area including the distal end of the second end section 28b is crushed by a predetermined press die 50. Thus, the thin plate section 40 is formed at the second end section 28b (refer to FIG. 6B).

Next, the pressing assembly 34 is fixed to the heat pipe 28. First, the heat pipe 28 is inserted into the split 42d of the base plate 42a, the second end section 28b being the leading end. At this time, the heat pipe 28 is passed through the surface (the lower surface) side of the second bridge section 45, and the thin plate section 40 at the utmost leading end is passed through the back surface 44a side of the first bridge section 44. Then, the base plate 42a, the bridge sections 44, 45, and the heat pipe 28 are fixed by soldering or the like. In the configuration including both the bridge sections 44 and 45, the step of, for example, joining the base plate 42a and the heat pipe 28 may be omitted. Further, the first bridge section 44 is placed at a position where the heat pipe 28 is pressed down, so that the step of joining to the heat pipe 28 may be omitted.

Before and after these steps, the first end section 28a of the heat pipe 28, the cooling fin 30, and the blower fan 32 are fixed by soldering or the like. This completes the manufacture of the cooling device 22.

Figure 7A:
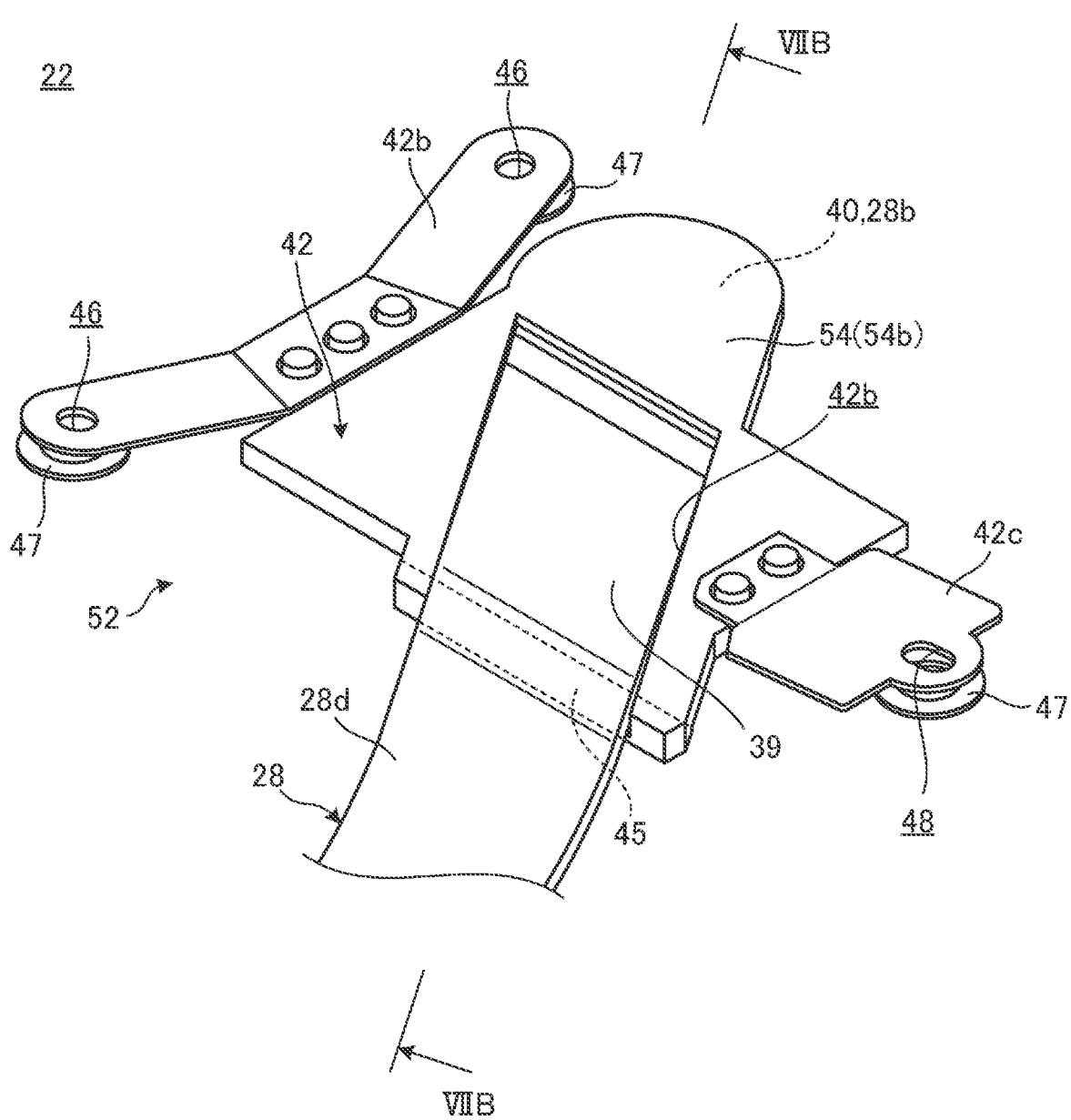
FIG. 7A is an enlarged perspective view of a pressing assembly and its surrounding area.
Figure 7B:
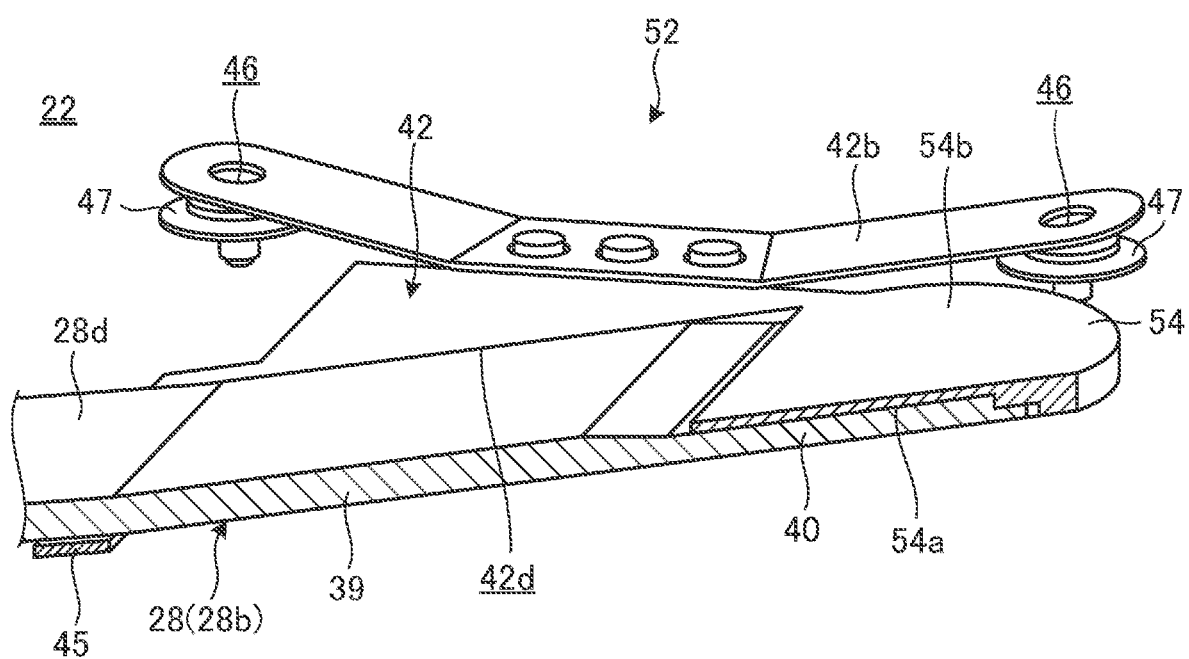
FIG. 7B is a schematic sectional view taken along line VIIB-VIIB in FIG. 7A.

FIG. 7A is an enlarged perspective view of a pressing assembly 52 and a surrounding area thereof according to a first modification example, which is viewed from below. FIG. 7B is a schematic sectional view taken along line VIIB-VIIB in FIG. 7A.

As illustrated in FIG. 7A and FIG. 7B, the pressing assembly 52 includes a first bridge section 54 having a configuration which is different from that of the first bridge section 44 of the pressing assembly 34 described above. The first bridge section 54 is shaped like a cover that wraps the surface of the thin plate section 40 (the lower surface 28d) and both side surfaces thereof in the width direction. Consequently, the first bridge section 54 is placed in such a manner as to extend in the width direction on the lower surface 28d side of the heat pipe 28. A back surface 54a of the first bridge section 54 and both side surfaces in the width direction are joined to the thin plate section 40 by soldering or the like. A front surface 54b of the first bridge section 54 is positioned so as to be flush with or lower than the surface of the heat absorbing section 39 (the lower surface 28d).

The pressing assembly 52 described above has even higher joint strength and holding rigidity between the first bridge section 54 and the heat pipe 28, as compared with the aforesaid pressing assembly 34. Thus, in the pressing assembly 52, the force for pressing the heat absorbing section 39 by the first bridge section 44 is further stabilized. Therefore, the pressing assembly 52 can firmly and stably press the heat absorbing section 39 against the CPU 26 when, for example, the second bridge section 45 is omitted.

FIG. 8 is an enlarged schematic side sectional view of a pressing assembly 56 and a surrounding area thereof according to a second modification example.

As illustrated in FIG. 8, the pressing assembly 56 includes a first bridge section 58 having a configuration which is different from that of the first bridge section 44 of the aforesaid pressing assembly 34. The aforesaid first bridge section 44 is placed in such a manner as to extend in the width direction on the lower surface 28d side of the heat pipe 28. On the other hand, the first bridge section 58 illustrated in FIG. 8 is placed in such a manner as to extend in the width direction on an upper surface 28c side of a heat pipe 28.

The pressing assembly 56 is used for the heat pipe 28 provided with a thin plate section 40 on the upper surface 28c side. The thin plate section 40 illustrated in FIG. 8 has a structure in which the upper surface 28c is crushed toward a lower surface 28d, which is a vertically reversed structure from the configuration example illustrated in FIG. 5. More specifically, a back surface 58a on the lower surface side of the first bridge section 58 is joined to the surface of the thin plate section 40 (the upper surface 28c) by soldering or the like. In the first bridge section 58, a surface 58b on the upper surface side opposes a substrate 26b, stiffeners 26c of a CPU 26, or a motherboard 24 or the like.

The present disclosure is not limited to the embodiments described above, and can of course be freely modified without departing from the gist of the present disclosure.

The invention claimed is:

1. An electronic apparatus comprising: a chassis; a heat generating element in the chassis; and a cooling device that has a cooling fin, a heat pipe connecting the cooling fin and the heat generating element, and a pressing assembly pressing the heat pipe against the heat generating element, wherein the cooling device is in the chassis, wherein the heat pipe has: a heat absorbing section that absorbs heat generated by the heat generating element; a heat dissipating section that dissipates the heat absorbed by the heat absorbing section to the cooling fin; and a thin plate section at an end portion that is on an opposite side from the heat dissipating section, and has a thickness which is smaller than that of the heat absorbing section, and the pressing assembly has: a base assembly fixed to the chassis; and a bridge section that is integral with the base assembly and is on a surface of the thin plate section to thereby extend over the heat pipe; wherein a first surface of the heat pipe is higher than a second surface of the heat pipe, thereby the thin plate section is thinner than the heat absorbing section, the bridge section is on a surface of a first surface side of the thin plate section, a surface of the bridge section is flush with or lower than the first surface of the heat pipe wherein the pressing assembly further has a second bridge section that sandwiches the heat absorbing section between itself and the bridge section, and extends over the heat pipe.

2. The electronic apparatus according to claim 1, wherein the second surface is connected to the heat generating element, and the first surface opposes an inner surface of the chassis.

3. The electronic apparatus according to claim 1, wherein the second bridge section is on the second surface of the heat pipe.

4. The electronic apparatus according to claim 3, wherein the thin plate section is at a position not overlapping the heat generating element.

* * * * *